(12) United States Patent
Fine et al.

(10) Patent No.: US 12,011,764 B1
(45) Date of Patent: Jun. 18, 2024

(54) METAL 3D PRINTED HEAT EXCHANGERS AND FLUID DIRECTING DEVICES

(71) Applicant: Agnitron Technology, Inc., Chanhassen, MN (US)

(72) Inventors: Aaron Fine, Golden Valley, MN (US); Andrei Osinksy, Chanhassen, MN (US); Evan Buskirk, Maple Grove, MN (US); Alexei Osinksy, Eden Prairie, MN (US)

(73) Assignee: Agnitron Technology, Inc., Chanhassen, MN (US)

( * ) Notice: Subject to any disclaimer, the term of this patent is extended or adjusted under 35 U.S.C. 154(b) by 0 days.

(21) Appl. No.: 18/110,280

(22) Filed: Feb. 15, 2023

(51) Int. Cl.
| | |
|---|---|
| *B22F 5/10* | (2006.01) |
| *B22F 10/85* | (2021.01) |
| *B22F 12/82* | (2021.01) |
| *B33Y 50/02* | (2015.01) |
| *B33Y 70/00* | (2020.01) |
| *B33Y 80/00* | (2015.01) |

(52) U.S. Cl.
CPC ............... *B22F 5/10* (2013.01); *B22F 10/85* (2021.01); *B22F 12/82* (2021.01); *B33Y 50/02* (2014.12); *B33Y 70/00* (2014.12); *B33Y 80/00* (2014.12)

(58) Field of Classification Search
CPC . B22F 5/10; B22F 10/85; B22F 12/82; B33Y 50/02; B33Y 70/00; B33Y 80/00
See application file for complete search history.

(56) References Cited

U.S. PATENT DOCUMENTS

| | | | |
|---|---|---|---|
| 9,233,504 B2* | 1/2016 | Douglas | B29C 64/209 |
| 9,528,632 B2* | 12/2016 | Glaun | B33Y 80/00 |
| 10,036,486 B2* | 7/2018 | Glaun | F16K 47/04 |
| 10,302,224 B2* | 5/2019 | Kluz | F16K 47/08 |
| 10,343,392 B2* | 7/2019 | Carter | B22F 10/30 |
| 10,500,675 B2* | 12/2019 | Cheverton | B22F 10/28 |
| 10,661,341 B2* | 5/2020 | Romano | B33Y 40/00 |
| 10,684,080 B2* | 6/2020 | Moore | F28F 3/02 |
| 10,760,158 B2* | 9/2020 | Shanbhag | H01J 37/3244 |
| 11,300,215 B2* | 4/2022 | Olberding | F16K 11/04 |
| 11,598,449 B2* | 3/2023 | Der Lieck | F16K 47/08 |
| 11,691,343 B2* | 7/2023 | Buller | B33Y 30/00 425/174 |
| 2022/0120349 A1* | 4/2022 | Williams | C23C 4/129 |

\* cited by examiner

*Primary Examiner* — Matthew W Jellett
*Assistant Examiner* — Christopher D Ballman
(74) *Attorney, Agent, or Firm* — Womble Bond Dickinson (US) LLP

(57) ABSTRACT

A fluid-directing device, which may be a CVD showerhead, includes a unitary body of additive metal construction, which may be made by 3D metal printing. The unitary body has a passage(s), fluid entrance(s), and fluid exit(s), arranged to direct fluid(s). The passage(s), fluid entrance(s) and fluid exit(s) include at least one cross-section shape not readily achieved through in-line drilling.

12 Claims, 13 Drawing Sheets

METAL 3D PRINTED HEAT EXCHANGERS AND FLUID DIRECTING DEVICES

BACKGROUND

Metal-Organic-Chemical Vapor Deposition (MOCVD) technology and other types of CVD technology such as CVD (Chemical Vapor Deposition), ALD (Atomic Layer Deposition, MBE (molecular beam epitaxy), PVD (Physical Vapor Deposition), etc. are used in materials processing, especially in the semiconductor industry, to produce various thin films deposited on various materials. Typically, and generalizing the above technologies to CVD technology, one or more CVD gases is/are introduced through a CVD showerhead into a CVD chamber in which a substrate is positioned at a designated level of pressure or vacuum, in a CVD system. The CVD chamber subjects the substrate to a particular chemical environment, which supports the deposition of layer(s) on the substrate. The showerhead distributes gas or gases (also known as precursors) into the chamber, and some showerheads also have fluid-based thermal regulation, using a gas, water or other liquid for cooling or heating (e.g., special oils can be used for keeping above typical temperatures). Many CVD processes use high temperature for processing. Some MOCVD or other CVD processes achieve preferred results by having the reactant gasses be at a particular temperature that may be hotter or colder than reactor ambient environment. These and other factors place stringent requirements on showerheads, including low leakage and high reliability under repeated exposure to pressure, vacuum, and thermal cycling. Conventional manufacturing techniques for showerheads, including computer numerical control (CNC) machining, cutting and assembly of multiple parts using brazing or welding to form a multipiece built up assembly, result in high costs and limited operational lifespan of showerheads from fatiguing. It is in this environment that present embodiments with improvements in showerheads and CVD technology arise.

SUMMARY

Described herein, in embodiments and variations thereof, are a fluid-directing device, a method of making a fluid-directing device, and a fluid-directing device that is a product of a process.

In one embodiment, a fluid-directing device has a unitary body of additive metal construction throughout. The unitary body has at least one passage, at least one fluid entrance, and at least one fluid exit, arranged to direct at least one fluid from the at least one fluid entrance through the at least one passage and the at least one fluid exit. The at least one passage, the at least one fluid entrance, and the at least one fluid exit include at least one cross-section shape not readily achieved through in-line drilling.

In one embodiment, a method of making a fluid-directing device includes defining an arrangement of at least one passage, at least one fluid entrance, and at least one fluid exit, in a unitary body. The arrangement is to direct at least one fluid from the at least one fluid entrance through the at least one passage and the at least one fluid exit. The at least one passage, the at least one fluid entrance, and the at least one fluid exit include at least one cross-section shape not readily achieved through in-line drilling. The method includes rendering the defined arrangement for the unitary body into machine-readable instructions for a metal 3D printer. The method includes using the metal 3D printer and the rendered instructions, constructing the unitary body by adding layers of metal according to the defined arrangement.

In one embodiment, a fluid-directing device is a product of a process. The process includes defining an arrangement of at least one passage, at least one fluid entrance, and at least one fluid exit, in a unitary body. The arrangement is to direct at least one fluid from the at least one fluid entrance through the at least one passage and the at least one fluid exit. The at least one passage, the at least one fluid entrance, and the at least one fluid exit include at least one cross-section shape not readily achieved through in-line drilling. The process includes rendering the defined arrangement for the unitary body into machine-readable instructions for a metal 3D printer. The process includes using the metal 3D printer and the rendered instructions, constructing the unitary body by adding layers of metal according to the defined arrangement.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1A:
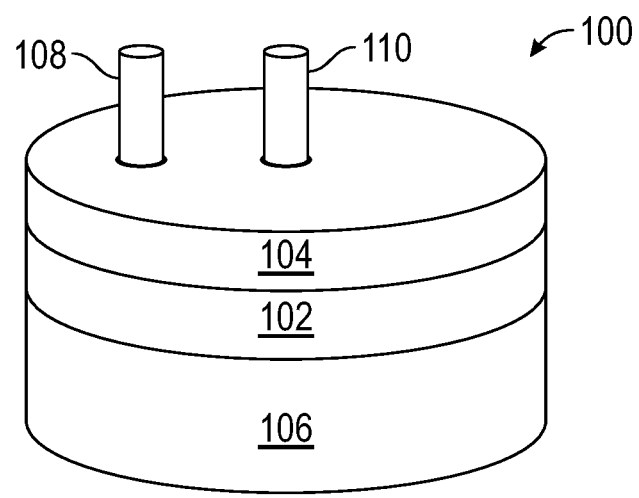
FIG. 1A depicts a perspective view of an embodiment of an apparatus that is part of a Metal-Organic-Chemical Vapor deposition (MOCVD) system, which includes a showerhead.

Various embodiments of fluid directing devices and heat exchangers, including a CVD showerhead and a CVD viewport, along with features, design and manufacturing techniques applying thereto, are described herein. It should be appreciated that embodiments herein described with respect to a specific CVD technology, e.g., MOCVD, serve as examples for CVD technology in general. Embodiments described with respect to a specific CVD technology, e.g., MOCVD, may include description general to CVD technology. Embodiments herein described with respect to CVD technology or a specific CVD technology, e.g., MOCVD, further serve as examples for fluid directing devices in general, and in some embodiments heat exchangers in general. As used herein, the term "fluid" encompasses liquids and gases, which are directed for various functions such as fluid distribution, chemical reactions, and thermal management or heat exchange. Embodiments herein depicted and described present technological solutions to a myriad of technological problems arising in chemical vapor deposition (CVD) technology, including high manufacturing cost of showerheads, and limited operational lifespan of showerheads due to fatiguing. Further, present embodiments add new features and capabilities in showerheads, which have been impossible to achieve with conventional manufacturing techniques and are now possible using additive metal technology and design innovation. It should still further be appreciated that various features herein described with respect to specific embodiments of apparatus and method can be combined in various combinations and variations in further embodiments of fluid directing devices, heat exchangers, showerheads, CVD reactors, CVD apparatus, etc., as readily envisioned and developed in accordance with the teachings herein.

With conventional showerhead manufacturing, holes are drilled in a straight line with cylindrical bores, using drill bits and in-line drilling. This is one process and technique available in computer numerical control (CNC) machining. Other processes and techniques available in conventional showerhead manufacturing include EDM (electrical discharge machining) for high precision wire and hole machining, AJM (abrasive jet machining), and various physical and chemical machining and etching techniques. In-line drilling cannot achieve curved bores, nor non-circular cross-section holes. EDM and AJM have many of the same limitations as CNC machining. CNC machining and EDM can be used for routing and milling techniques, to produce channels of various shapes in a workpiece, but these are open-roof so to speak, not enclosed and sealed. In order to enclose a channel, e.g., to form a passage or plenum for a showerhead, conventional manufacturing techniques involve cutting and brazing or welding on another piece to the CNC (or other process) machined piece. With conventional manufacturing techniques, machining a workpiece then building up by brazing and welding with further piece(s), to form a showerhead, is a time-consuming and costly process. The resultant machined, brazed and/or welded multi-piece built up showerhead may have defects as a result of the relatively large number of potential defect locations in such a product and process, or defects may show up as early failures after a low number of CVD runs in a CVD system. Brazing or welding may introduce different metals, and the resulting built up product then has differential coefficient of expansion at joints and can develop thermal stress cracks from thermal cycling. For example, some CVD showerheads operate in proximity to objects (such as susceptors, wafer carriers, heaters, etc.) that are at temperatures that range from 500° C.-1200° C. with some filaments getting over 1500° C.-2300° C., and these high temperature parts being in close proximity for prolong periods of times, and in some times with some thermal cycling can result in the development of micro cracks resulting in micro amounts of fluid (gas and liquid) leaking into a ultra-high purity environment after as few as 100 runs or cycles, leading to replacement of a showerhead that can range from tens to hundreds of thousands of dollars. Improved reliability of at least 1000 cycles is desired, and a design goal of various embodiments, as are cost reduction and achievement of new features.

Another consideration is that complex welding and brazing processes, which could possibly produce useful features in a showerhead, are not presently automated for the MOCVD industry. Welding fixtures that would be used are not even remotely as accurate (e.g., for production tolerances) as presently disclosed techniques.

Additive metal technology, for example using metal 3D printing, and corresponding CAD (computer-aided design)/CAM (computer-aided manufacturing) tools and systems, brings about new capabilities and characteristics for workpieces. A showerhead that is of additive metal construction throughout, not built up through brazing or welding from a machined (metal subtractive process) piece and further pieces, does not have the same differential coefficient of expansion at joints as a welded or brazed piece and is less susceptible to developing thermal stress cracks from thermal cycling. Machining introduces stresses to the workpiece that additive metal construction pieces do not have. A showerhead that is of additive metal construction throughout can have shapes of passages, plenums, inlets and outlets that were difficult or impossible to achieve from conventional manufacturing. Additive metal construction is layer by layer. Where conventional drilling cannot drill a partial hole in a middle of a piece, additive metal construction can form such a shape, and more. A showerhead made with the additive metal construction techniques and features described herein can have internal geometries that were formerly impossible to make, have thinner walls, better thermal conduction, better capability of regulating thermally, be produced for lower cost, have fewer initial defects and have greater initial and long-term reliability over a larger number of thermal cycles. In some embodiments, showerheads can be made in batches of multiple units in parallel on a metal 3D printer, further reducing costs in comparison to singular piece CNC machining and one unit assembly with brazing and welding at a time. Embodiments described below are examples in CVD technology, and further embodiments of heat exchangers and fluid directing devices in this and further technologies may be developed in accordance with the teachings herein.

FIG. 1A depicts a perspective view of an embodiment of an apparatus 100 that is part of a Metal-Organic-Chemical Vapor Deposition (MOCVD) system, which includes a showerhead 102. The showerhead 102, described in various embodiments below, delivers one or more gases to a CVD chamber inside the MOCVD system (or more generally, a CVD system), and circulates water (or other liquid or gas, i.e., fluid) for cooling (or heating), thus directing fluids as a fluid directing device, and regulating temperature as a heat exchanger. The CVD chamber is inside the closed reactor environment system. Typically, and in this embodiment as shown, the apparatus 100 is assembled of multiple CVD components, or CVD reactor components, for example a CVD top 104 with various gas, liquid and vacuum fittings 108, 110, a showerhead 102 and a CVD bottom 106. The CVD bottom 106 could have or be a CVD reactor mating flange, in various embodiments. Such CVD (or CVD reactor) components may be clamped together or otherwise assembled, and may have further fittings, handling and assembly hardware such as handles, clamps, brackets, etc. as readily understood and devised. There may be multiple fittings 108, 110 such as fluid inlets, fluid outlets, fluid inlet/outlets, vacuum fittings, and these may be made to the various components of a CVD system and not limited to just one fitting 108, and another fitting 110, to the CVD top 104, etc. (see, e.g., FIG. 1B). Some embodiments include a viewport (see FIGS. 9 and 10) to a CVD chamber. Variations in further embodiments of showerheads, with other tubes, multiple gas fittings, other flanges, gaskets, fewer or greater number of pieces, etc., in keeping with the teachings herein, are understood and readily devised.

Figure 1B:
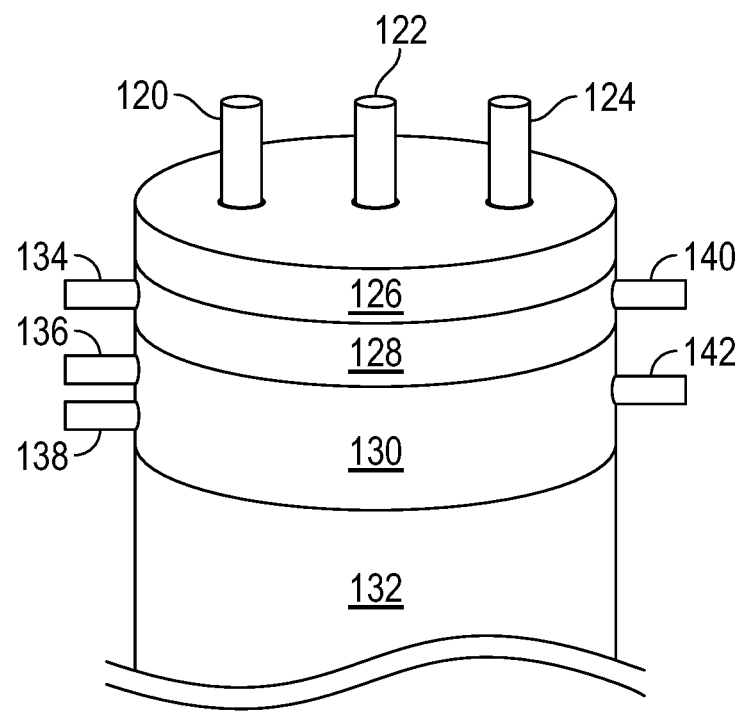
FIG. 1B depicts a perspective view of another embodiment of an apparatus that is part of an MOCVD system, which includes a showerhead.

FIG. 1B depicts a perspective view of another embodiment of an apparatus that is part of an MOCVD system, which includes a showerhead 128. In this embodiment, a CVD top 126 has fittings 120, 122, 124, each of which could be a gas, liquid or vacuum fitting that couples to the showerhead 128. In various embodiments, the CVD top 126 can also be 3D printed using additive metal technology, can be part of the showerhead 128 with the whole as a single 3D printed piece, or separate piece(s) of other technology, etc. Showerhead 128 has fittings 134, 140, each of which could be a gas, liquid or vacuum fitting, i.e., fluid fittings, or singles or multiples thereof. A CVD bottom 130 couples to the showerhead 128, and has fittings 136, 138, 142, each of which could be a gas, liquid or vacuum fitting. The CVD bottom 130 couples to a CVD base 132, which provides a CVD reactor environment. A CVD chamber is within the assembled apparatus, defined by a void therein, with the showerhead 128 and the various fittings 120, 120 20, 124, 134, 136, 138, 140, 142 arranged to provide the various gases, vacuum, and in some embodiments cooling fluid, as used in the CVD reactor. Of interest, the CVD reactor environment, including the CVD chamber, is also referred to as the vacuum environment, and is where the CVD process happens. Further variations, for the showerhead, for the apparatus, and for various CVD systems, are readily devised.

Figure 2A:
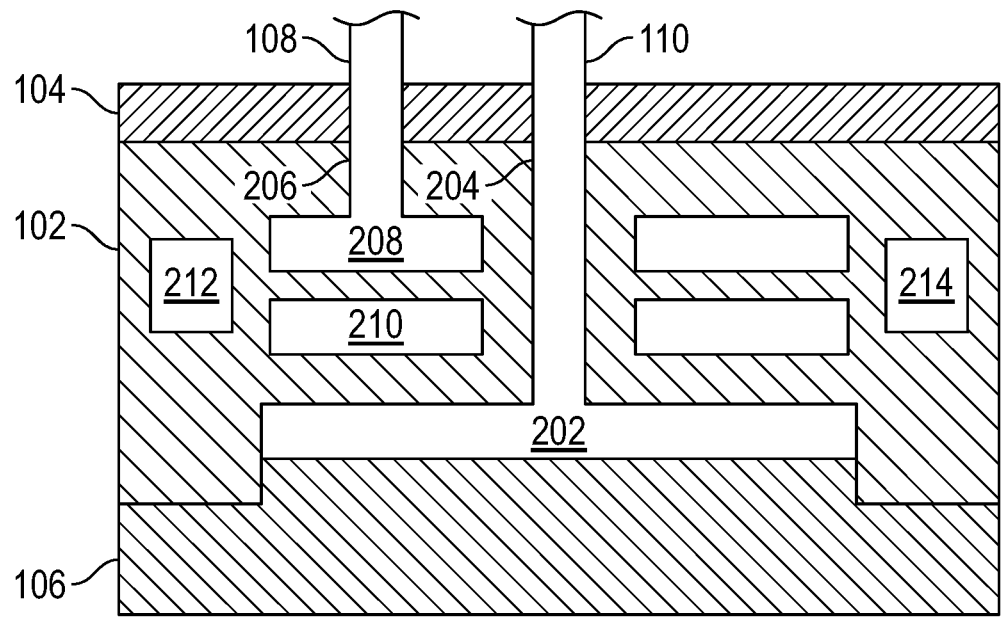
FIG. 2A is one embodiment in a vertical cross-section view of an apparatus that is part of an MOCVD system, such as shown in FIG. 1A or 1B.

FIG. 2A is one embodiment in a vertical cross-section view of an apparatus that is part of an MOCVD system, such as shown in FIG. 1A or 1B. A fitting 110 (or passage) supplies a gas through a cylindrical walled passage 204, which may also be considered an inlet and outlet, or nozzle in various embodiments, to the CVD chamber 202 that is below the showerhead 102 and within the CVD reactor environment, which may be made of one or more subassemblies (not shown). In one variation embodiment, the chamber 202 is a plenum, and one or more passages (not visible in this cross-section view but readily envisioned, see also FIGS. 2D-2G) fluidly connect from the chamber 202 or plenum, to a CVD chamber in the CVD bottom 106, which provides the CVD reactor environment. In variations, passage 204 could have other shapes and need not necessarily be cylindrical. For example, the passage 204 could include one or more slots, apertures, vertical or angled walls, and various cross-section shapes. A further fitting 108 (or passage) supplies a CVD gas (selected according to desired deposition) through the CVD top 104 utilizing the inlet 206 (or pass-through) to a plenum 208 in the showerhead 102, from which the CVD gas is introduced to the CVD chamber 202 through nozzles of the showerhead 102 as further described below. In some embodiments, the plenum 208 is sealed off with ultra-low leak down rate and supports high vacuum. In a variation embodiment, passage(s) and/or plenum(s) divert a CVD gas for heat exchanger or other process(es). Another gas supply fitting supplies another gas to a further plenum 210 in the showerhead 102, from which that gas is introduced to the CVD chamber 202 through further nozzles of the showerhead 102 as further described below. Alternatively, in other embodiments, a fluid supply fitting supplies another fluid to a further plenum, or can be utilized as a heat exchanger, depending on particular showerhead design. A showerhead can have just one, or far more than two plenums, etc. The two plenums 208, 210 and associated sets of nozzles, in this particular example, are isolated from one another and the outside ambient environment so as to operate independently for supplying different gases, as arranged through the complex design and manufacturing using additive metal construction for the showerhead 102. Water, oil or other fluid (e.g., a gas) for cooling or heating circulates through passages 212, 214. Passages or plenums may be used for various fluids, and for various functions such as vacuum, gas delivery, dual seal (or more), heating or cooling, in various embodiments. Passages or plenums may be at one level, for example with common floor and/or common ceiling, or may be at multiple levels, for example with differing floors and/or differing ceilings. Alternatively, floors and/or ceilings at different levels, and built up geometries at such differing levels, can define passages and/or plenums at different levels.

Figure 2B:
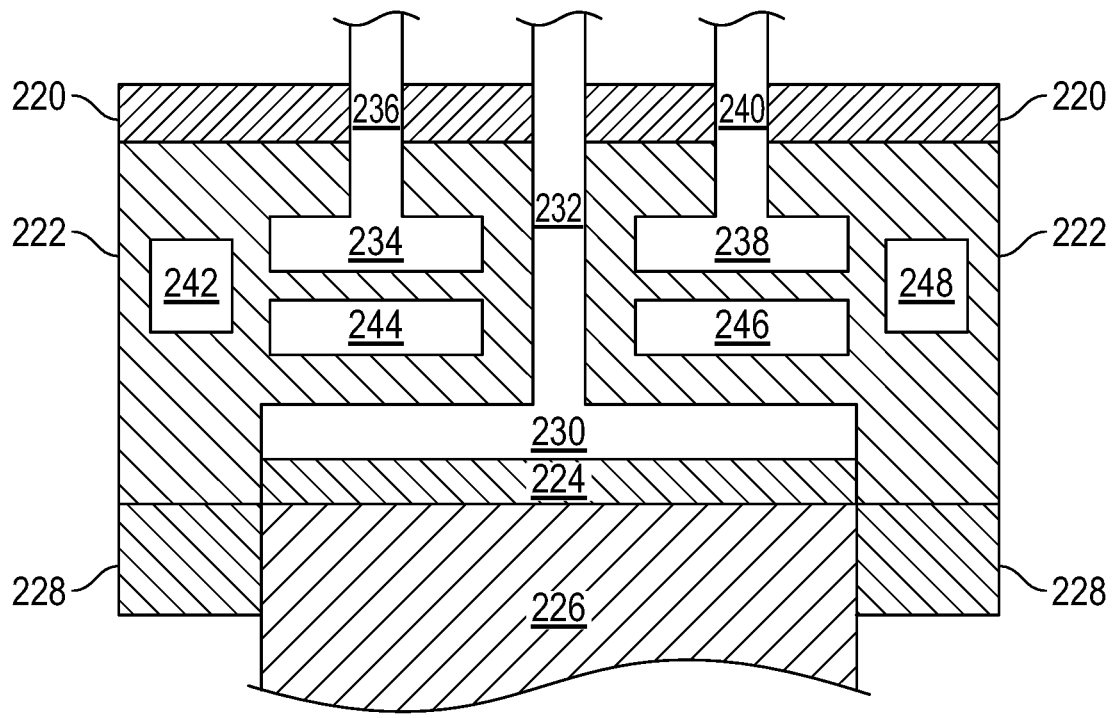
FIG. 2B is another embodiment in a vertical cross-section view of an apparatus that is part of an MOCVD system, such as shown in FIG. 1A or 1B.

FIG. 2B is another embodiment in a vertical cross-section view of an apparatus that is part of an MOCVD system, such as shown in FIG. 1A or 1B. In this embodiment, a CVD top 220 couples to showerhead main body 222, which includes a lower part of the apparatus formed by a CVD base 226 coupled to the showerhead main body 222 by a coupler 228 to form the showerhead. A plenum acting as a CVD chamber 230 is formed as a void defined by surfaces of the showerhead main body 222 and a plenum plug 224, and a reactor environment is within a CVD base 226, which could have multiple components as subassemblies. In turn, alternatively the CVD chamber is defined by a void (not shown but readily envisioned, see also FIGS. 2D-2G) within the CVD base 226. It is understood that a substrate is exposed to CVD processing in the CVD chamber 230, through operation of the showerhead main body 222 specifically and the apparatus and CVD system generally. One passage 236 fluidly connects to a plenum 234 (or chamber), another passage 240 fluidly connects to another plenum 238 (or chamber), and a passage 232 connects to the plenum acting as the CVD chamber 230, all through the showerhead main body 222. By fluidly connects, it is meant that a fluid, e.g., a gas or a liquid, can be conveyed, or alternatively a vacuum can be introduced or maintained, through such a fluid connection. Which of these is appropriate for a given fluid connection is specific to a specific apparatus and CVD process, as readily determined by the practitioner in the art.

Showerhead main body 222 has further voids 232, 244, 246, 248, which can be passages, chambers, plenums, or combinations thereof in various embodiments, with various further fluid connections. For example, various passages, plenums, chambers in various combinations can carry reaction gases to feed into the reactor environment through one or more nozzles slots or whatever gas distribution method is best for the process, e.g., outside current flow, central injection, arrays of nozzles, etc, It is further understood that a void can be introduced formed within a body through additive metal technology, without fluid connection to further passages, plenums or chambers, (e.g., an empty, hollow cavity) for example for purposes of lowering costs of 3D printing materials and time or reducing mass or weight of a component or assembly, in various embodiments. It has been shown that any metal powder left over in a cavity, that cannot be blown out because the cavity is sealed, can withstand ultra-high vacuum with no contamination.

Figure 2C:
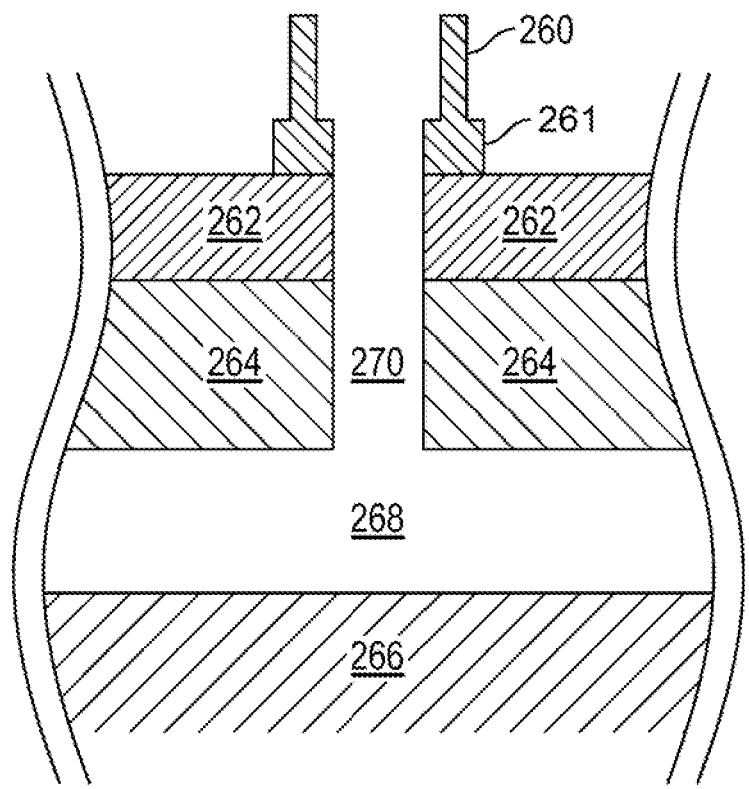
FIG. 2C is another embodiment in a vertical cross-section view of an apparatus that is part of an MOCVD system, such as shown in FIG. 1A or 1B.

FIG. 2C is yet another embodiment in a vertical cross-section view of an apparatus that is part of an MOCVD system, such as shown in FIG. 1A or 1B. In this embodiment, a tube 260 (shown in cross-section) has a flange 261 that is brazed, welded or soldered to a first body 262, which is assembled to a second body 264, at an opening of a passage 270 fluidly coupled to a CVD chamber 268 (or, a plenum in a further embodiment). In one embodiment, this piece is made as follows. A showerhead is built up metal layer by metal layer as a unitive body of additive metal construction, using 3D metal printing, defining both a ceiling of the CVD chamber 268 or plenum and the passage 270. Different metals are used, so that the second body 264 is built up using one type of metal (or alloy, generally included as a type of metal), and the first body 262 attached to the second body 264 is built up by continuing to add layers, of a different metal, one that is weldable or brazeable on top of the second body 264. Additive metal construction, with this design, thus builds the unitary body that has two different types of metal, providing a surface at a specified feature (in this case an inlet or outlet of the passage 270), to which the flange 261 of the tube 260 is welded or brazed.

Figure 2D:
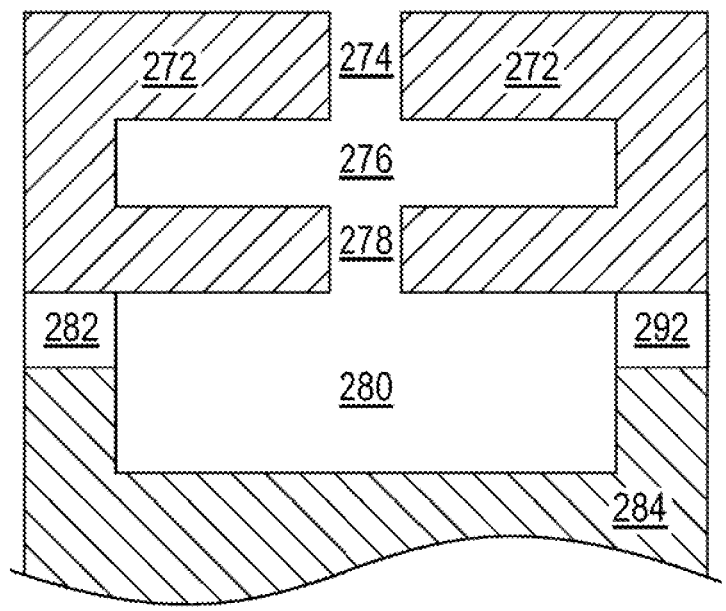
FIG. 2D is another embodiment in a vertical cross-section view of an apparatus that is part of an MOCVD system, such as shown in FIG. 1A or 1B.

FIG. 2D is another embodiment in a vertical cross-section view of an apparatus that is part of an MOCVD system, such as shown in FIG. 1A or 1B. In this embodiment, a showerhead 272 couples to a CVD base 284 with a coupler 282, defining a passage 274, a plenum 276 and passage 278 fluidly connected within the showerhead 272, and a CVD chamber 280 within the CVD base 284. The passage 278 fluidly connects the plenum 276, in the showerhead 272, and the CVD chamber 280, within the CVD base 284, providing the reactor environment. These and further features can be formed using additive metal technology.

Figure 2E:
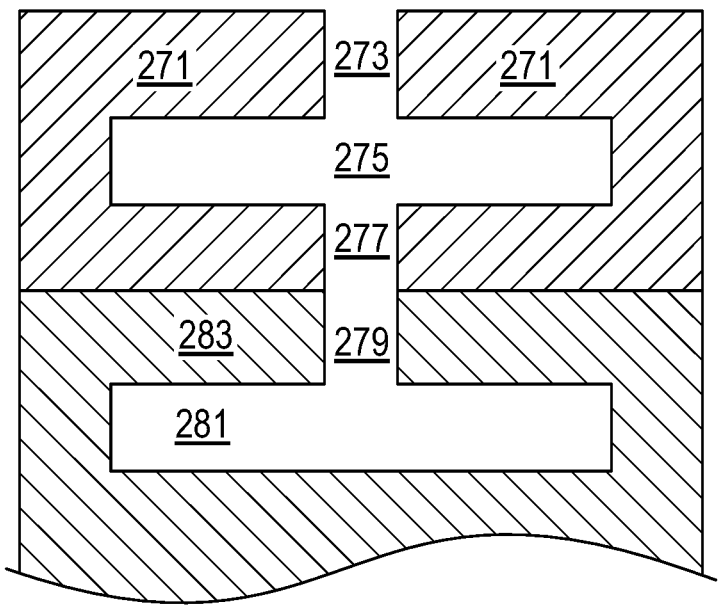
FIG. 2E is another embodiment in a vertical cross-section view of an apparatus that is part of an MOCVD system, such as shown in FIG. 1A or 1B.

FIG. 2E is another embodiment in a vertical cross-section view of an apparatus that is part of an MOCVD system, such as shown in FIG. 1A or 1B. As a variation of the embodiment in FIG. 2D, this embodiment features a CVD chamber 281 deeper within the CVD base 283. A passage 373, a plenum 275 and a passage 277, formed as a fluidly connected void within the showerhead 271, are fluidly connected through a passage 279 to a CVD chamber 281 in the CVD base 283, providing the reactor environment. These and further features can be formed using additive metal technology.

Figure 2F:
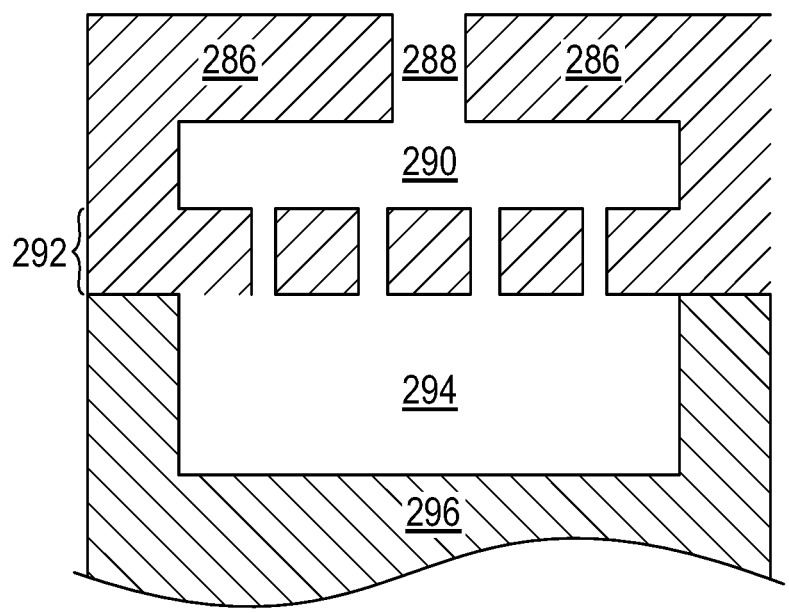
FIG. 2F is another embodiment in a vertical cross-section view of an apparatus that is part of an MOCVD system, such as shown in FIG. 1A or 1B.

FIG. 2F is another embodiment in a vertical cross-section view of an apparatus that is part of an MOCVD system, such as shown in FIG. 1A or 1B. As a variation of the embodiment in FIG. 2D, this embodiment features multiple passages 292 fluidly connecting a plenum 290, in the showerhead 292, and a CVD chamber 294 within the CVD base 296. A passage 288, formed in the showerhead 292, fluidly connects to the plenum 290 within the showerhead 292. These and further features can be formed using additive metal technology.

Figure 2G:
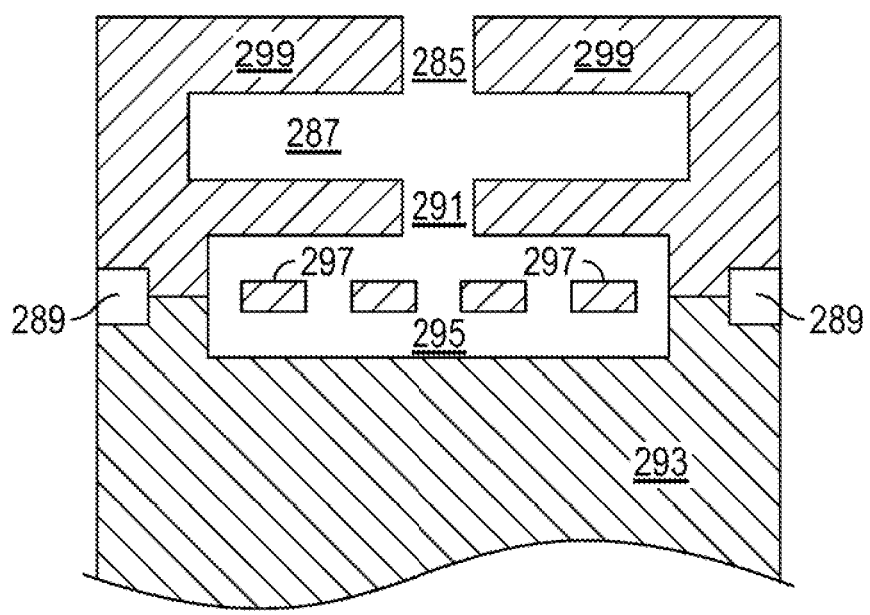
FIG. 2G is yet another embodiment in a vertical cross-section view of an apparatus that is part of an MOCVD system, such as shown in FIG. 1A or 1B.

FIG. 2G is yet another embodiment in a vertical cross-section view of an apparatus that is part of an MOCVD system, such as shown in FIG. 1A or 1B. As a variation of the embodiments in FIGS. 2D and 2F, this embodiment features a branched passage 291 fluidly connecting a plenum 287 within the showerhead 283, and a CVD chamber 295 within a CVD base 293, providing the reactor environment. The showerhead 299 is coupled to the CVD base 293 with a coupler 289. What appear in this cross-section view to be distinct islands are actually metal portions 297 of the showerhead 299, which is formed integrally using additive metal technology, leaving the branched passage 291, plenum 287 and passage 285 all fluidly connected to one another as a void within the showerhead 299.

Figure 3:
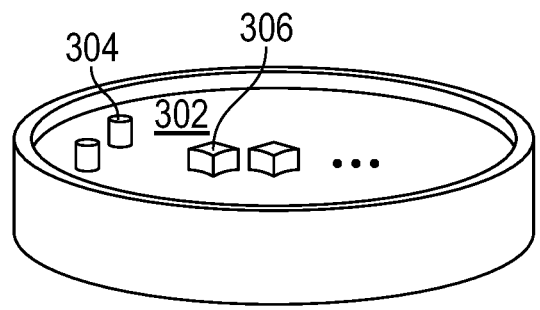
FIG. 3 is a horizontal cross-section in perspective view of one embodiment of the apparatus of FIG. 1A or FIG. 1B, depicting various features of one embodiment of a showerhead, which is designable and manufacturable using additive metal technology, features and techniques described herein.

FIG. 3 is a horizontal cross-section in perspective view of one embodiment of apparatus of FIG. 1A or FIG. 1B, depicting various features of one embodiment of a showerhead 102, which is designable and manufacturable using additive metal technology, features and techniques described herein. For example, the showerhead 102 is built up metal layer by metal layer as a unitary body of additive metal construction throughout, using 3D metal printing. This creates passages for fluid inlet(s), with the floor 302 built up by metal layering over these passages (not seen in the drawing), and projections 304, 306 rising from the floor 302. There can be multiple such floors and ceilings, completed passageways, etc., with projections bridging from one floor to a ceiling that forms another floor above, and plenums, passageways such as water passage(s), etc. embedded therein, with vertical passages and nozzles formed integrally in the structure to pass fluid through a ceiling or floor. These and other features, both solid (defined by presence of metal) and voided (defined by absence of metal), are built into embodiments of the showerhead 102, using additive metal technology. For example, multiple built up solid structures can define passages or plenums where the solid structures are not present.

Figure 4:
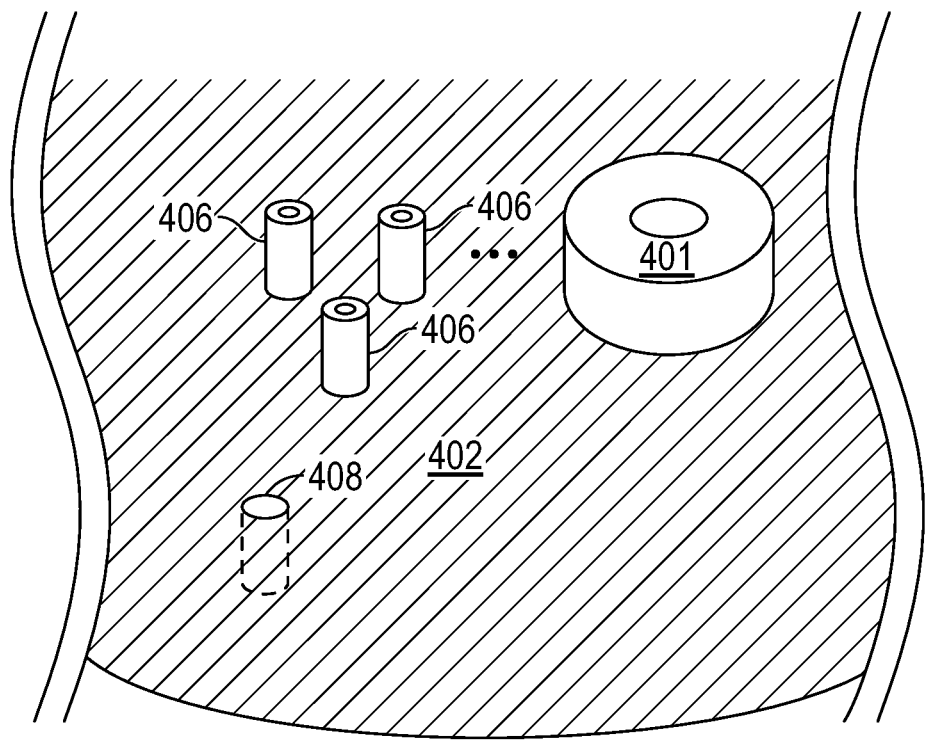
FIG. 4. is a horizontal cross section in perspective view of one embodiment of the apparatus of FIG. 1 or FIG. 1B, which uses additive metal technology, features and techniques described herein.

FIG. 4 is a horizontal cross-section in perspective view of one embodiment of the apparatus of FIG. 1A or FIG. 1B, which uses additive metal technology, features and techniques described herein. A vertical passage 408 outside of the nozzle region passes a fluid (i.e., gas or liquid) vertically. Structures that can be considered nozzles 406 are seen as vertical, cylindrical walled structures, extending from a floor 402, with passages through the cylindrical walled structures and through the floor 402, that deliver a fluid into the showerhead 102, then through the showerhead 102 to a plenum or to a CVD chamber, or in a further embodiment through a nozzle or array of nozzles following a plenum into the chamber reactor. In one embodiment, the nozzles 406 (or more specifically, the cylindrical walls of the nozzles) connect to a plenum that is higher up than this cross-section view while the vertical passage 408 connects the plenum that is within this cross-section view to the reactor (not shown in FIG. 4, but see, e.g., FIG. 2). In further embodiments, the various shapes can change to whatever array is best suited for either chemical fluid mixing within the reactor or with a specified velocity or volume flow that is directed towards a particular portion of the reactor. Projections may be amid a further passage and may provide structural strength to the unitary body and/or baffling for a fluid in the passage. Another, cylindrical walled passage 401 (or other shaped structure, in embodiments) delivers a gas, in one embodiment, or more generally a fluid through the floor 402 out of the showerhead 102, to a plenum or to the CVD chamber. In one embodiment, water or other fluid for cooling circulates in the void (i.e., no deposited metal here) surrounding nozzles 406 and cylindrical walled passage 404, thermally regulating these structures and the walls, floor and ceiling of this chamber. In this showerhead 102 embodiment, and variations thereof, a liquid or gas, i.e. fluid, circulates in various passages and fluid contact with various structures, for thermal regulation, heat exchange, and liquid or gas, i.e. fluid, cooling of the showerhead 102. In further embodiments, more than one liquid could circulate, and/or a gas or more than one gas, i.e., one or more fluids, could circulate, in various passages, for these functions.

Figure 5:
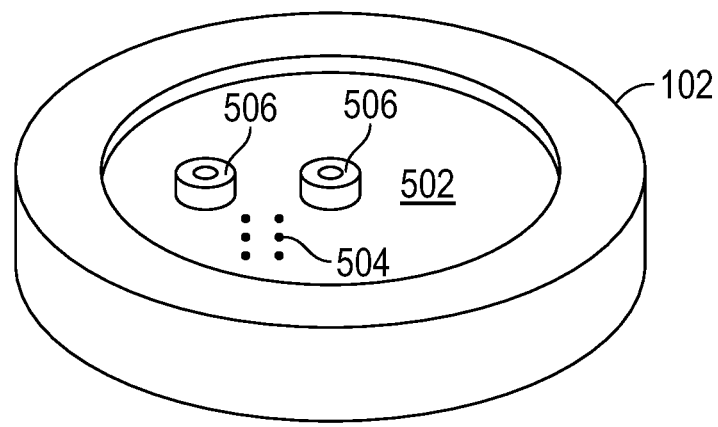
FIG. 5. is a horizontal cross section in perspective view of one embodiment of the apparatus of FIG. 1 or FIG. 1B.

FIG. 5 is a horizontal cross-section in perspective view of one embodiment of the apparatus of FIG. 1A or FIG. 1B. This cross-section is horizontally across the showerhead 102, just below the CVD top component 104, which could also be made using additive metal construction in one embodiment. The CVD top component 104 seals to the showerhead 102, for example using a metal gasket, dual seal, or O-ring, for coupling the various gas supplies to the cylindrical walled passage 204 and inlet 206 (see FIG. 2A) and other cylindrical walled passages or apertures. Holes 504 (which may be called apertures, inlets or outlets depending on perspective) in a ceiling 502 of the showerhead 102 admit a gas, for example to a plenum, from a plenum, or from one plenum to another plenum. Cylindrical walled passages 506 (which may be of differing or similar sizes, and in various locations) pass a fluid through the ceiling 502, for example to a plenum below the ceiling 502 and within the showerhead. Further combinations of plenums, passages and locations for such are possible in variations.

FIGS. 1-5, depicting various embodiments at various views and various elevations as described above, are useful in understanding how to use various embodiments of the showerhead in a CVD system, and shed light on various features of the embodiments that show improvements in CVD technology. With reference to FIGS. 6-8, 11 and 12, description now turns to how to make various embodiments of the showerhead, and further heat exchangers and fluid directing devices including a viewport shown in FIGS. 9 and 10, highlighting both the design and manufacturing aspects. Further emphasis is given on various features of the embodiments that show improvements in CVD technology. Methods, processes, techniques and technology described with reference to FIGS. 6-12 can be used to make various embodiments of showerheads and other CVD components, fluid directing devices and heat exchangers described with reference to FIGS. 1-5, and further such components as readily devised.

Additive metal construction, e.g., using a 3D metal printer, builds up the unitary body layer by layer, and the layers can be of the same metal, or in some embodiments, of differing metals. Copper, aluminum, Inconel, tungsten, stainless steel and other metals, including metal alloys, are available for additive metal construction, in various embodiments. Metals can also be combined into different layers, for example a layer of Inconel than another layer of copper. Even on the same layer, two or more differing metals can be laid down in different regions of that layer, for example with multiple passes. For example, stainless steel (or other weldable metal) could be used for some layer(s) or portion(s) of one or more layers, to form a surface or structure to which an external component can be welded. This is useful for welding fittings onto a unitary body made of additive metal construction throughout the unitary body.

In various embodiments, design data, e.g., in a CAD database, CAM database, or CAD/CAM database, represents a design of a showerhead or other component. A CAD system or CAD tool can be used to generate perspective views of a portion or all of a component, and generate cross-section views of a portion or all of a component, which are particularly useful in representing layers for manufacturing and also user visualization of a component. Such views can be displayed, for example on a computer monitor or virtual reality (VR) equipment, or printed, e.g., as mechanical drawings and "blueprints", in various appropriate formats. Examples are described below.

Figure 6:
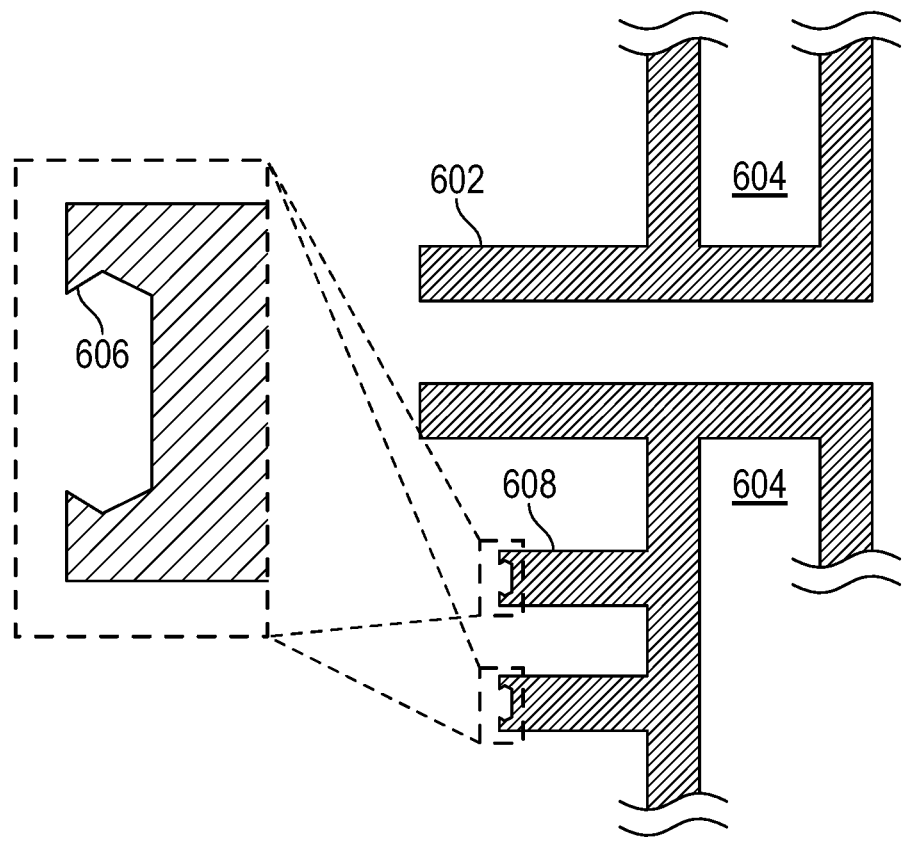
FIG. 6 is a vertical cross-section view of a portion of a showerhead, in accordance with an embodiment.

FIG. 6 is a vertical cross-section view of a showerhead 102, in accordance with an embodiment. Leftmost in FIG. 6 is a drawing of a section, featuring a depression with sunken conic expansion and reverse conic finished depth in a ring at the top of the cylindrical walled passage 608 in the drawing to the right in FIG. 6. These complex features may be used for gasket sealing to fluid connectors, providing improved seating for a gasket in comparison to conventional milled cylindrical routing with vertical, not conic walls. In some embodiments, apertures correspond to differing CVD gases, and appropriate fluid passages and plenums are arranged for independent and separate directing of the CVD gases.

Figure 7:
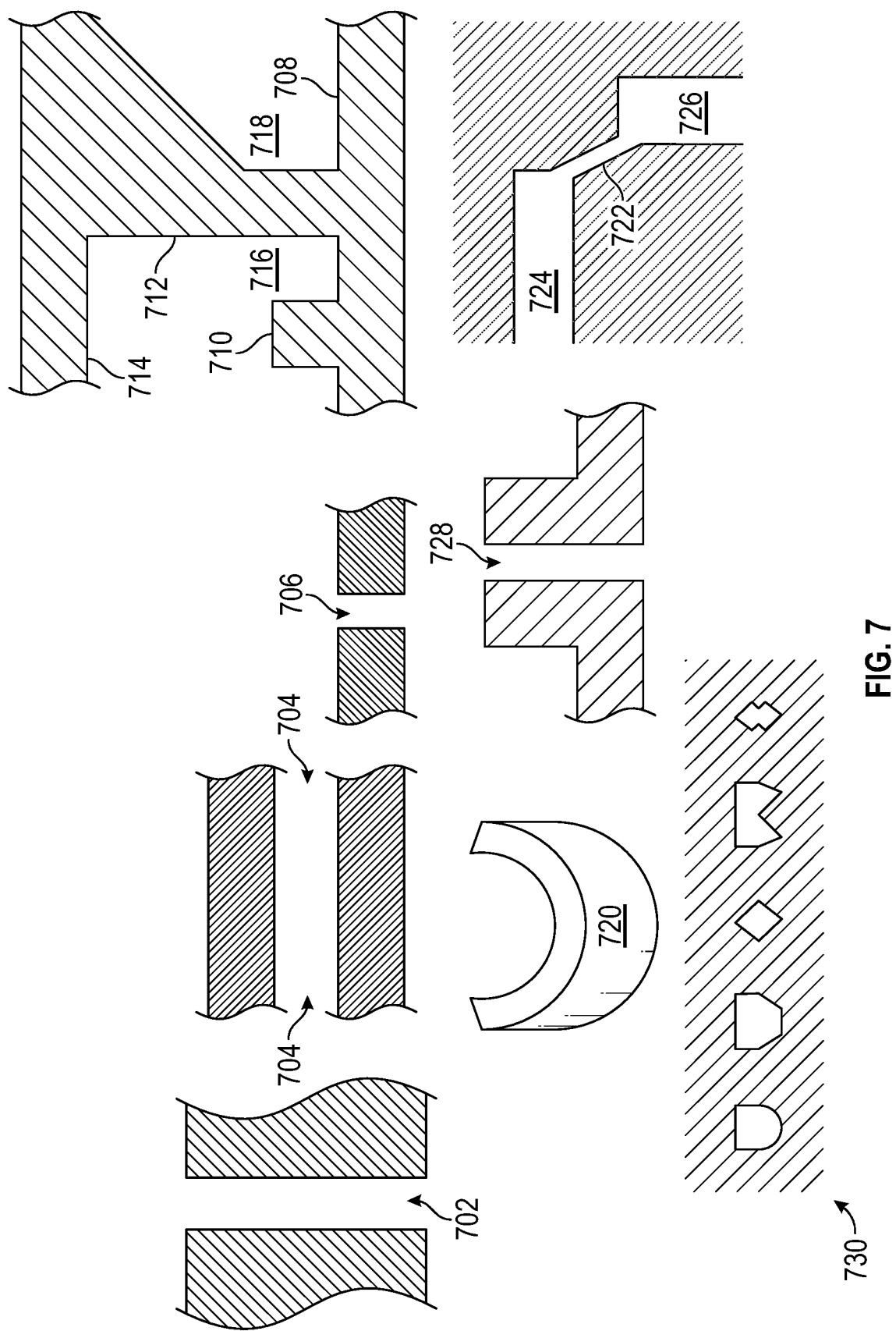
FIG. 7 is further views of features of a showerhead, in an embodiment.

FIG. 7 is further views of features of a showerhead, in an embodiment. Placement of various vertical passages 702 and horizontal passages 704, nozzles 706, 728, floor 708, projections 710 from the floor 708 which may be baffles or structural support 712 (e.g., columns, free-standing walls, posts) for a ceiling 714 to form a plenum 716 or chamber 718, circular arcs 720, angled and buried joins 722 of passages 724, 726, and further features are visible in the drawings, as are complex shapes of voided regions 730 (i.e. regions where additive metal is not deposited in manufacturing the unitary body), which may be, e.g., cross sections of passages, structures in plenums, chambers, slots, or nozzles, etc.

Figure 8:
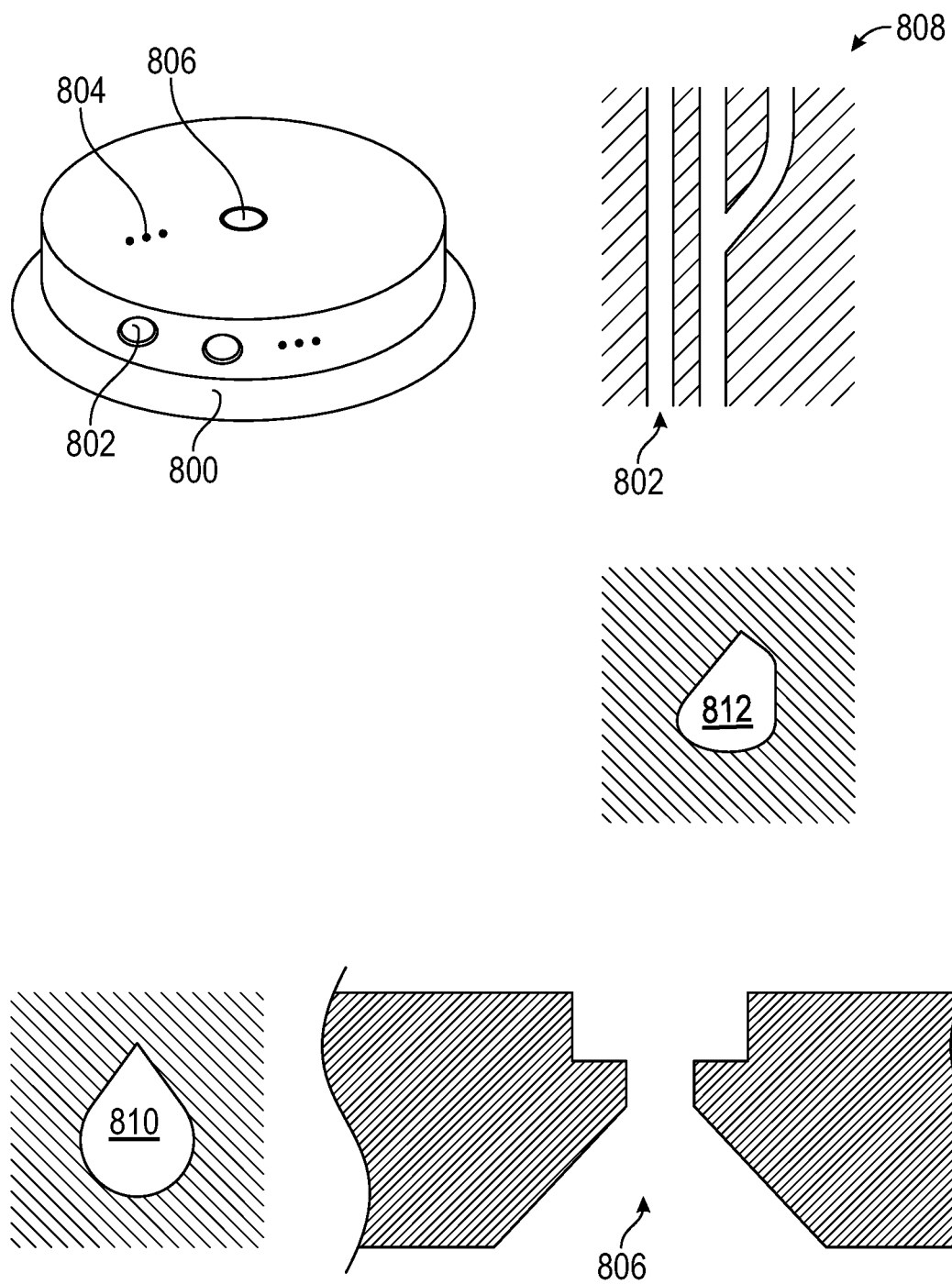
FIG. 8 depicts various views of a different embodiment of a showerhead, which uses additive metal technology, features and techniques described herein.

FIG. 8 depicts various views of a different embodiment of a showerhead 800, which is uses additive metal technology, features and techniques described herein. Horizontal passages 802, 808 are used for water or other fluid cooling of the showerhead 800, and particularly feature a curved passage 808 joining another passage, with complex passage cross-section 812 with rounded walls, angled and peaked high-point ceiling, etc. Passages 802, 808 are arranged to avoid vertical passages 804, for gases, and avoid the central nozzle 806, especially through the curved and joined passages which nonetheless provide approximately uniform spacing and arrangement of cooling fluid passages in one embodiment. Horizontal passages 802, 808 could also have a teardrop cross-section 810, which may be advantageous in fluid flow and fluid surface area contact to walls for cooling and thermal regulation, in comparison to standard cylindrical bores achieved through in-line drilling, e.g., in CNC machining. Horizontal passages 802 and 808 could also have cross-sections of other shapes such as, for example, pentagon cross-sections. This could be up to the design specifications or the limitations for the additive metal printing system that the chosen vendor has. One or more nozzle 806 has a complex shape with a cylindrical fluid inlet, circular restriction aperture and expanding cone fluid exit, as built using additive metal technology.

Another factor affecting some embodiments of ceilings of passages, plenums, chambers and other voided regions formed by additive metal technology is that some 3D metal printers are unable to form a large, horizontal, flat region of additive metal above a void, as portions of metal being added with each pass would find insufficient support and would collapse into the void creating a defect in the finished workpiece. In embodiments so affected, one technique is to build up additive metal on a slope as a supported cantilever, leading to sloped ceiling, or peaked hi-point ceiling features for passages, plenums, chambers or other voided regions. Appropriate designs with the above constraints include the teardrop cross-section 810, the peaked roof of the cross-section 812 of a passage, some of the voided regions 730 described above with reference to FIG. 7, and further angled, non-zero sloped, peaked, rounded or other non-horizontal ceilings. Some 3D printers may be able to support small horizontal, flat regions of additive metal above a void, but be constrained as to a maximum width, length, area or other dimension of such a ceiling surface of a void. It is envisioned that 3D printers could be developed that support larger horizontal, flat regions of additive metal, but such shapes as described above could nonetheless still be used.

Figure 9:
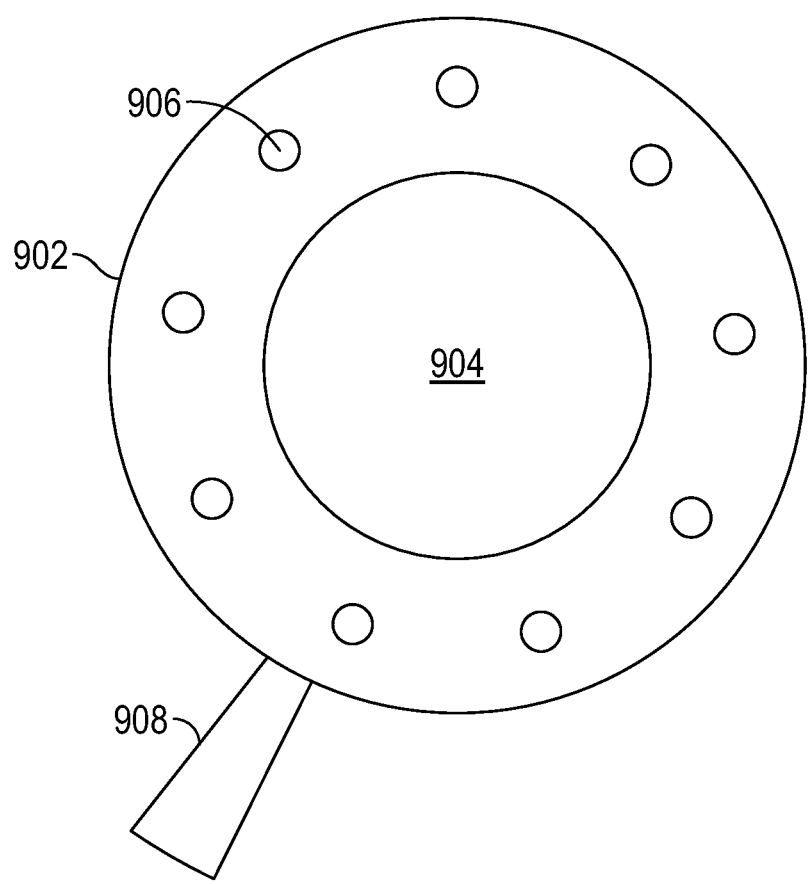
FIG. 9 depicts a typical viewport, used in vacuum systems.

FIG. 9 depicts a typical viewport 902, used in vacuum systems. A standard viewport has a viewport window 904, usually a piece of high temperature, high pressure, low permeability glass (e.g., quartz glass) assembled to the metal body of the viewport, and holes for insertion of bolts 906 or other fasteners to attach the viewport to an aperture in a wall of the CVD system. Typically, the viewport window 904 (shown here in FIG. 9 and further applicable in FIG. 10) is a separate part entirely, which is sealed to the sealing top surface of the metal body of the viewport 902, for example through a CF (conflat), ISO (International Standards Organization), or other O-ring seal. In some versions of a viewport window 904, and as shown here in FIG. 9, the same bolts 906 or other fasteners that attach the viewport 902 to a CVD system also attach a purge assembly. A fluid fitting 908 is coupled to the metal body of the viewport, to provide a purge gas for purging CVD gases from the viewport window 904. In the embodiment depicted in FIG. 10, the metal body of the viewport has improved features.

Figure 10:
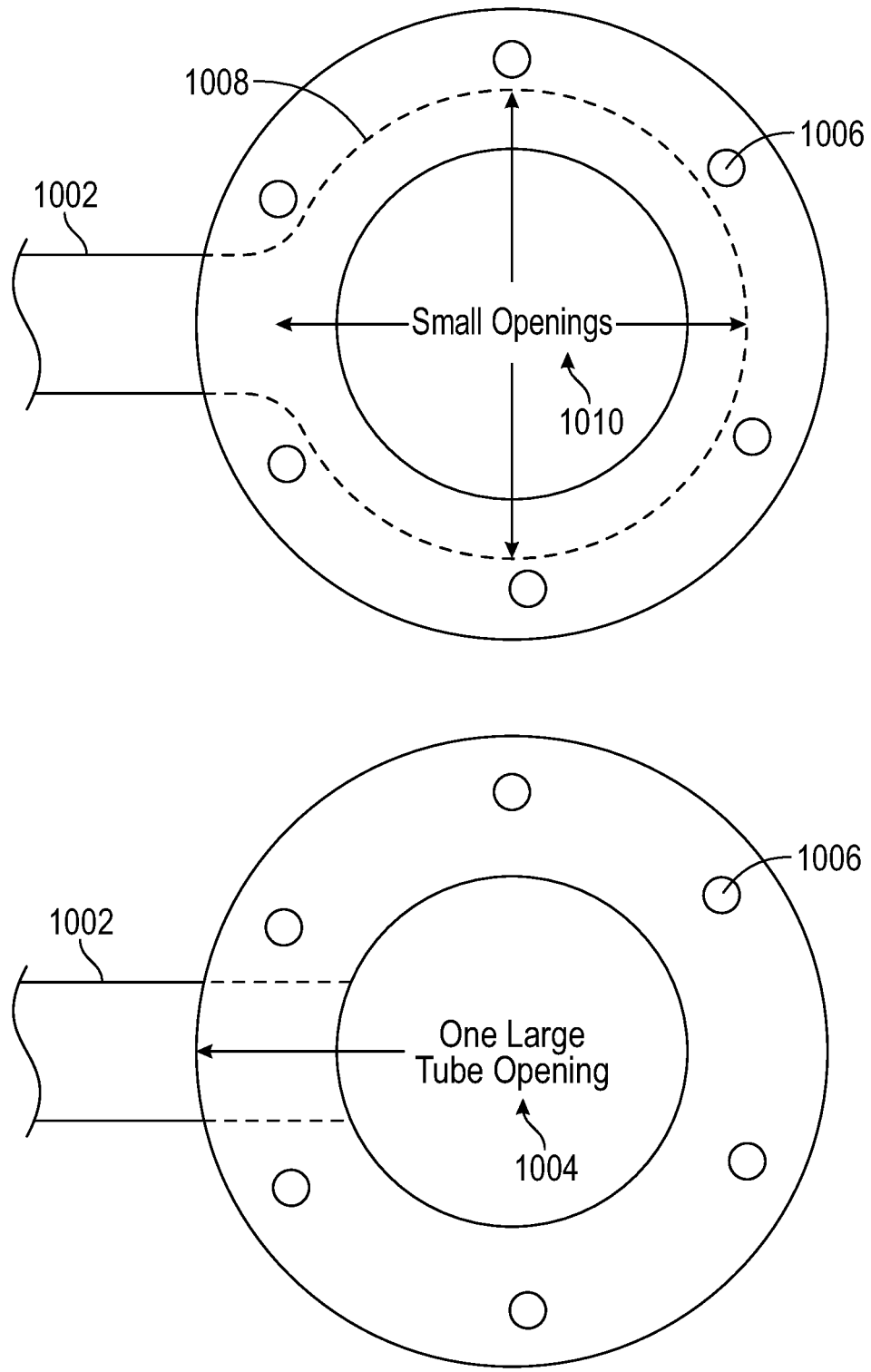
FIG. 10 depicts an embodiment of a viewport, which is designable and manufacturable using additive metal technology, features and techniques described herein.

FIG. 10 depicts an embodiment of a viewport, which is designable and manufacturable using additive metal technology, features and techniques described herein. At the bottom in FIG. 10, a conventional viewport purge design has an inlet 1002 and one large tube opening 1004, through which a purge gas can purge CVD gases as described above with reference to FIG. 9. At the top in FIG. 10, a new design and embodiment of the metal body of the viewport is made as a unitary body having additive metal construction throughout, featuring an inlet 1002 fluidly connected to a curved passage 1008 that is further fluidly connected to small openings 1010 distributed around the viewport window 904 (see FIG. 9). This would generally not be possible in a typical CNC machining or EDM process and product. It should be appreciated that the viewport window 904 is attached after manufacture of the metal, unitary body, and the design is arranged to accommodate this assembly procedure and structure.

Figure 11:
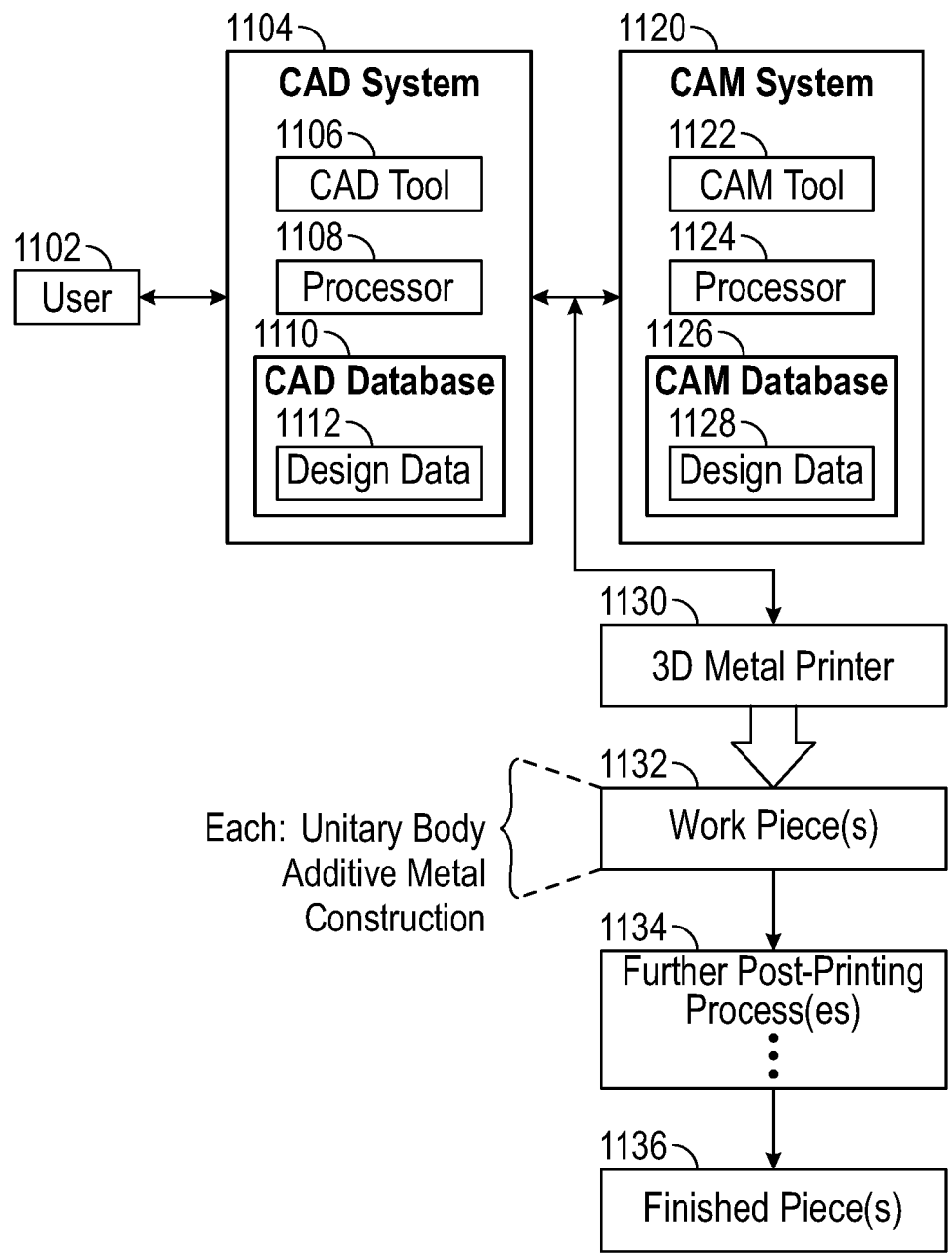
FIG. 11 illustrates a system for making showerheads, heat exchangers or fluid directing devices, in accordance with embodiments.

FIG. 11 illustrates a system for making showerheads, heat exchangers or fluid directing devices, in accordance with embodiments. A user 1102 interacts with a CAD system 1104 and a CAM system 1120, which could be combined into a CAD/CAM system in a further embodiment, to create design data 1112 in a CAD database 1110, representing a design of the component of interest in appropriate format. The CAD system 1104 has a CAD tool 1106 executing on a processor 1108 to populate the CAD database 1110. Design data 1112 of the CAD database 1110 is ported to the CAM system 1120, through the CAM tool 1122 operating on the processor 1124, which populates the CAM database 1126 with the design data 1128, in appropriate format. Alternatively, in a further embodiment, there is a unified CAD/CAM database with design data in appropriate format as used in both designing and manufacturing. Variations on CAD/CAM systems that would operate in accordance with present embodiments are readily devised.

CAM system 1120 (or in various embodiments, the CAD system 1104 or a CAD/CAM system) operates or ports data to a 3D metal printer 1130, to direct manufacturing of one or more workpieces 1132 by the 3D metal printer 1130. Here, each workpiece is a unitary body of additive metal construction throughout, for example a showerhead, a heat exchanger or a fluid directing device. Furthermore, the various data in various formats represents the design features of the unitary body, directing manufacture of same with such features as are advantageous in CVD technology or other technology, as described above. The 3D metal printer 1130 could be used to produce workpieces 1132 serially, i.e., one after the other. In some embodiments, the 3D metal printer 1130 can produce multiple workpieces 1132 in parallel, which is advantageous in reducing cost and time to delivery.

There may be further post-printing processes 1134, to produce finished pieces 1136. For example, there could be machining (e.g., manually with machining tools or using CNC), polishing, drilling, plating, surface treatment, heating and quenching, gun drilling, EDM, further operations to make the exterior even more versatile, etc. A unitary body that has appropriate metal for welding or brazing, on a portion of or all of the unitary body, could have one or more additional pieces brazed or welded to the unitary body to create the finished piece. One or more additional pieces could be assembled to a unitary body, for example with fasteners or adhesives (see, e.g., fluid fittings, viewport window, metal gaskets, etc., described above). Such further post-printing processes 1134 can be applied serially or singularly to each workpiece, or operate on workpieces in batches in parallel, and involve manual assembly, automated assembly, etc. as appropriate to a given embodiment.

In some embodiments, the 3D printed heat exchanger has a heat pipe. In some embodiments, the heat pipe is coupled (e.g., soldered) into a cavity in the heat exchanger. In some other embodiments, the heat pipe is integrated into the heat exchanger. In some embodiments, the integration occurs by 3D printing the heat pipe as part of the 3D printing of the heat exchanger. In some embodiments, the heat pipe can be 3D printed using any number of materials. For example, the heat pipe can be 3D printed using copper, aluminum, titanium, gold, or another thermally conducting material, or any combination thereof. As one example, the heat pipe is 3D printed using two or more materials (e.g., copper and aluminum). In some embodiments, the heat pipe is 3D printed directly on the heat exchanger, such that the heat exchanger and the heat pipe form a single contiguous component. In some other embodiments, the heat pipe, or portion thereof, is 3D printed within the heat exchanger. The 3D printing can include depositing successive layers of material under computer control based on a 3D model to produce the heat pipe and/or the heat exchanger.

Figure 12:
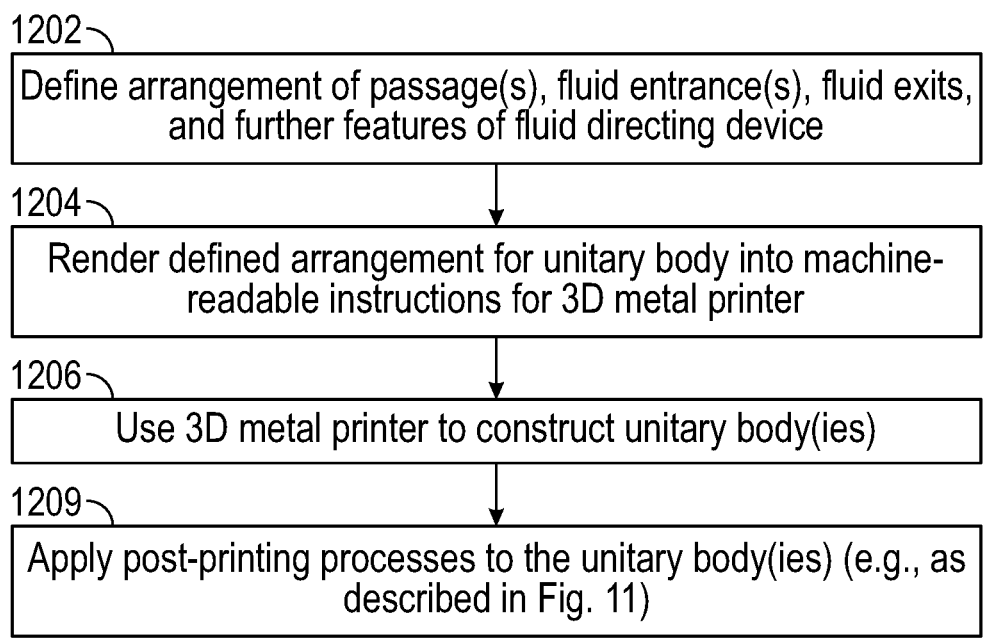
FIG. 12 illustrates a flow diagram, showing a process for making a fluid-directing device in accordance with embodiments described herein.

FIG. 12 illustrates a flow diagram, showing a process for making a fluid-directing device in accordance with embodiments described herein. The process can be embodied as a method, encompassing design and manufacturing of embodiments. The process is performed through user interaction with machines, or alternatively is performed through machines with user interaction.

In an action 1202, an arrangement of passage(s), fluid entrance(s), fluid exit(s), and further features of a fluid-directing device are defined. Typically, a user is involved as this is a design process, although one can envision artificial intelligence systems defining a product. For example, a user designs a fluid-directing device, using a CAD system as described with reference to FIG. 11. In one version of the process, action 1202 is performed integrally with action 1204 (e.g., user designing on a combined CAD/CAM system, directly into a database for 3D metal printing). In some embodiments, features in the defined arrangement for the fluid-directing device include a passage, fluid entrance or fluid exit that has a cross-section shape not readily achieved through in-line drilling, so as to take advantage of capabilities of metal 3D printing as contributory to improvements in CVD technology.

In an action 1204, the defined arrangement for the unitary body is rendered into machine-readable instructions for a 3D metal printer. For example, design data in a CAD database could be ported to design data in a CAM database, or design data could be directly rendered in a CAD/CAM database during the design process. See FIG. 11 and variations thereof.

In an action 1206, a 3D metal printer is used to construct a unitary body, or multiple copies of the unitary body. For example, as described with reference to FIG. 11, the 3D metal printer could produce one or more workpieces, with each workpiece being a unitary body of additive metal construction. Workpieces could be produced serially, or in parallel, in various embodiments.

In an action 1208, post-printing processes are applied to the unitary body, as described in FIG. 11. It should be appreciated that the action 1208 applies to some embodiments of a method, and other embodiments of a method omit the action 1208. A still further embodiment of a method has the action 1208 as a selectable option.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A chemical vapor deposition (CVD) showerhead, comprising:
   a unitary body of the CVD showerhead, of additive metal construction;
   the unitary body having at least one passage, at least one fluid entrance, and at least one fluid exit, arranged to direct at least one fluid from the at least one fluid entrance through the at least one passage and the at least one fluid exit; and
   the at least one passage, the at least one fluid entrance and the at least one fluid exit including at least one cross-section shape that is not a straight line cylindrical bore as could be achieved through in-line drilling.

2. The CVD showerhead of claim 1, wherein:
   the unitary body of the CVD showerhead, as a result of the additive metal construction, includes construction of the at least one passage, the at least one fluid entrance and the at least one fluid exit without brazing or welding.

3. The CVD showerhead of claim 1, wherein the additive metal construction of the unitary body of the CVD showerhead comprises at least one layer comprising a first metal, and at least one layer comprising a second metal.

4. The CVD showerhead of claim 1, wherein the additive metal construction of the unitary body of the CVD showerhead comprises at least a first layer having at least a portion thereof of stainless steel, at least a second layer having at least a portion thereof of copper, and at least a third layer having at least a portion thereof of Inconel.

5. The CVD showerhead of claim 1, wherein at least one void in the unitary body of the CVD showerhead of additive metal construction comprises a non-horizontal ceiling or a high-point peaked ceiling.

6. The CVD showerhead of claim 1, wherein:
   the at least one cross-section shape includes a teardrop cross-section shape of a passage.

7. The CVD showerhead of claim 1, wherein:
   the at least one cross-section shape includes a cross-section of a cone, with a fluid exit having a corresponding cone shape.

8. The CVD showerhead of claim 1, wherein:
   the at least one cross-section shape includes a curved shape of a passage.

9. The CVD showerhead of claim 1, wherein:
   the at least one cross-section shape includes passage curvature and a splitting or joining of passages.

10. The CVD showerhead of claim 1, wherein:
    the at least one fluid entrance comprises at least a first fluid entrance for a first fluid and at least a second fluid entrance for a second fluid;
    the at least one fluid exit comprises a first at least one fluid exit for the first fluid, connected through at least one first passage to the at least a first fluid entrance for the first fluid, arranged to direct the first fluid from the CVD showerhead into a CVD chamber; and
    the at least one fluid exit further comprises a second at least one fluid exit for the second fluid, connected through at least one second passage to the at least a second fluid entrance for the second fluid, arranged to direct the second fluid for fluid cooling of the CVD showerhead.

11. A chemical vapor deposition (CVD) showerhead, comprising:
    a unitary body of the CVD showerhead of additive metal construction;
    the unitary body having at least one passage, at least one fluid entrance, and at least one fluid exit, arranged to direct at least one fluid from the at least one fluid entrance through the at least one passage and the at least one fluid exit;
    the at least one passage, the at least one fluid entrance and the at least one fluid exit including at least one cross-section shape that is not a straight line cylindrical bore as could be achieved through in-line drilling;
    the additive metal construction of the unitary body including a plurality of layers of differing metals; and at least one of the plurality of layers including at least a portion of stainless steel or other weldable metal; and
    a fluid coupler welded to the stainless steel or other weldable metal of the at least one of the plurality of layers at a fluid entrance, arranged to deliver a fluid or vacuum to the fluid entrance of the unitary body.

12. A fluid-directing device having a viewport, comprising:
    a unitary body of additive metal construction;
    the unitary body having at least one passage, at least one fluid entrance, and at least one fluid exit, arranged to direct at least one fluid from the at least one fluid entrance through the at least one passage and the at least one fluid exit;
    the at least one passage, the at least one fluid entrance and the at least one fluid exit including at least one cross-section shape that is not a straight line cylindrical bore as could be achieved through in-line drilling;
    a transparent viewing window attached to the unitary body, as a portion of the viewport;
    the at least one passage having curvature; and
    the at least one fluid entrance, the at least one passage and the at least one fluid exit comprising a plurality of fluid exits arranged to purge a gas from the transparent viewing window of the viewport.

* * * * *